US010256796B2

(12) United States Patent
Hsin et al.

(10) Patent No.: US 10,256,796 B2
(45) Date of Patent: Apr. 9, 2019

(54) MASTER-SLAVE LEVEL SHIFTER ARRAY ARCHITECTURE WITH PRE-DEFINED POWER-UP STATES

(71) Applicant: QUALCOMM Incorporated, San Diego, CA (US)

(72) Inventors: Shih-Chieh Hsin, San Diego, CA (US); Med Nariman, Ladera Ranch, CA (US); Jingcheng Zhuang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/448,657

(22) Filed: Mar. 3, 2017

(65) Prior Publication Data

US 2018/0254772 A1 Sep. 6, 2018

(51) Int. Cl.
  *H03K 3/3562* (2006.01)
  *H03K 19/0185* (2006.01)
  *H03K 3/356* (2006.01)

(52) U.S. Cl.
  CPC ..... *H03K 3/35625* (2013.01); *H03K 3/35613* (2013.01); *H03K 3/356182* (2013.01); *H03K 19/018521* (2013.01)

(58) Field of Classification Search
  CPC ....... H03K 3/35625; H03K 19/018521; H03K 3/3562
  See application file for complete search history.

(56) References Cited

U.S. PATENT DOCUMENTS

| 6,373,285 | B1 | 4/2002 | Konishi |
| 6,843,699 | B2 | 1/2005 | Davis |
| 7,026,855 | B2 | 4/2006 | Sueoka et al. |
| 7,111,183 | B1* | 9/2006 | Klein ......................... G06F 1/26 713/1 |
| 7,205,820 | B1 | 4/2007 | Yeung et al. |
| 8,063,662 | B2 | 11/2011 | Foley et al. |
| 8,723,551 | B2 | 5/2014 | Cho |
| 8,984,463 | B2 | 3/2015 | Xie et al. |
| 9,208,860 | B2 | 12/2015 | Ngo et al. |
| 9,257,973 | B1 | 2/2016 | Shay |
| 2002/0011883 | A1 | 1/2002 | Yamazaki et al. |
| 2007/0290735 | A1 | 12/2007 | Ali et al. |
| 2008/0048719 | A1 | 2/2008 | Ogawa |
| 2009/0251193 | A1 | 10/2009 | Lo et al. |
| 2014/0253201 | A1 | 9/2014 | Jung et al. |
| 2014/0266385 | A1 | 9/2014 | Pigott et al. |
| 2015/0277544 | A1 | 10/2015 | Ramakrishnan et al. |

(Continued)

FOREIGN PATENT DOCUMENTS

WO  WO-2016098593 A1  6/2016

OTHER PUBLICATIONS

International Search Report and Written Opinion—PCT/US2018/018619—ISA/EPO—May 30, 2018.

*Primary Examiner* — Jung Kim
(74) *Attorney, Agent, or Firm* — Haynes and Boone, LLP (57) ABSTRACT

A master-slave level shifter array includes an asymmetric master level shifter having a predefined output state that produces an enable signal to drive an array of symmetric slave level shifters during a power collapse. As a result, the slave level shifter array has a reliable output state during a power collapse, while also providing wafer area savings due to their small symmetric characteristics.

10 Claims, 4 Drawing Sheets

(56) References Cited

U.S. PATENT DOCUMENTS

2015/0303921 A1   10/2015  Jung et al.
2017/0237426 A1*  8/2017  Draxelmayr .............. G06F 1/24
                                                           327/143
2018/0062655 A1    3/2018  Park et al.

* cited by examiner

Master:

| inp | vddin | vddout | latch | out | out_b |
|---|---|---|---|---|---|
| X | X | 0 | X | X | X |
| X | 0 | 0->1 | 0 | latch | latch |
| X | 0 | 1 | latch | latch | latch |
| 0 | 1 | 1 | 0 | 0 | 1 |
| 1 | 1 | 1 | 1 | 1 | 0 |

Slave:

| inp | vddin | vddout | enb | latch | out |
|---|---|---|---|---|---|
| X | X | X | 1 | latch | 0 |
| X | X | 0 | 0 | X | X |
| X | 0 | 0->1 | 0 | 0 | latch |
| X | 0 | 1 | 0 | latch | latch |
| 0 | 1 | 1 | 0 | 0 | 0 |
| 1 | 1 | 1 | 0 | 1 | 1 |

MASTER-SLAVE LEVEL SHIFTER ARRAY ARCHITECTURE WITH PRE-DEFINED POWER-UP STATES

FIELD OF THE DISCLOSURE

Embodiments of present disclosure generally relate to level-shifters and, more particularly, to level shifters and related methods using a master level shifter to control an array of slave level shifters.

BACKGROUND

Level shifters are used in current systems to level shift from a core power supply voltage to another power supply voltage. Conventional level shifters include a latch formed by two-cross-coupled inverters. For example, conventional level-shifter 100 shown in FIG. 1 includes a first inverter 115 formed by a serial stack of a PMOS transistor P1 and an NMOS transistor M2 that is cross-coupled with a second inverter 120 formed by another serial stack of a PMOS transistor P2 and an NMOS transistor M3. The drains of transistors P2 and M3 form a true output node (OUT) for level-shifter 100. Similarly, the drains of transistors P1 and M2 form a complement output node (OUTB). Cross-coupled inverters 115 and 120 are located within an input output (I/O) power domain powered by an I/O power supply voltage (VDDIO) that is greater than a core power supply voltage (VDD) that powers a pair of input inverters 105 and 110.

Figure 1:
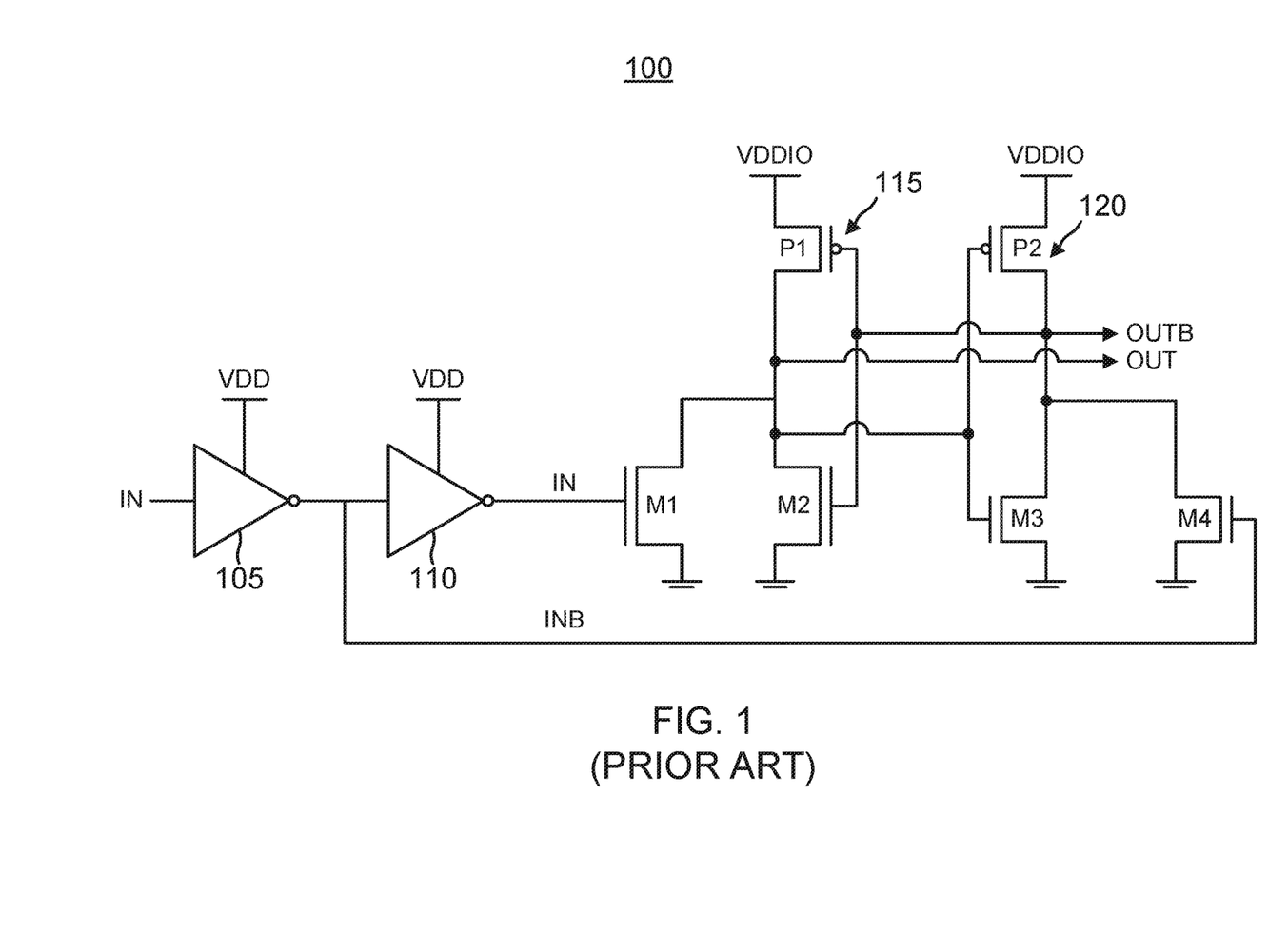
FIG. 1 is a circuit diagram of a conventional level shifter.

Inverter 105 inverts a true input signal IN into a complement input signal (INB) that drives a gate of a pull-down NMOS transistor M4 coupled between the output node and ground. Inverter 110 inverts the complement input signal back into the true input signal IN to drive a gate of a pull-down NMOS transistor M1 coupled between the complement output node OUTB and ground. Depending upon the state of the true input signal IN, one of the pull-down transistors M1 and M4 switches on to ground the corresponding one of the true and complement output nodes. Due to the feedback through the cross-coupled inverters 115 and 120, the non-grounded one of the true and complement output nodes is then charged to the I/O power supply voltage. The true input signal IN is thus level-shifted from the core power supply voltage to the I/O power supply voltage.

There are drawbacks to conventional level shifter designs. Conventional level shifters may output either a binary 0 or 1 when the input power domain collapses (e.g., at start-up, power failure, sleep or hibernation mode, or some other power transition). This output logic uncertainty may lead to unwanted leakage. Thus, in order to ensure a known state at power-up, costly asymmetrical designs are utilized. With reference to FIG. 1, note that the pull-down transistors M1 and M4 may be relatively large so that they can change the state of the latch formed by cross-coupled inverters 115 and 120. For example, if the state of this latch was such that the true output node was charged to the I/O power supply voltage, the PMOS transistor P1 was switched on. To flip the state of the latch such that the complement output node is instead charged to the I/O power supply voltage employs the pull-down transistor M1 to discharge the complement output node despite the PMOS transistor P1 initially being on and continuing to charge this node. A similar struggle occurs between pull-down transistor M4 and PMOS transistor P2 when flipping the latch from storing a logical one to storing a logical zero (the complement output node transitioning from charged to the I/O power supply voltage to being discharged). Making the pull-down transistors M1 and M4 relatively large compared to either of the inverter transistors M2 and M3 (and thus in turn to either of the inverter transistors P1 and P2) allows the struggle to be completed relatively quickly so that level-shifter 100 may have high-speed operation.

A similar difference in transistor size may ensure that level-shifter 100 has a known state at power-up. In particular, at power-up both the true input signal IN and its complement INB will be grounded such that both pull-down transistors M1 and M4 are off. The true output node and the complement output nodes for level-shifter 100 will also be grounded such that the inverter transistors M2 and M3 are also off. As the I/O power supply rises, both inverter transistors P1 and P2 will thus be initially on such that they charge their drains to cause the true output node and the complement output node to rise in voltage. Without any asymmetry for inverters 115 and 120, it may then be unpredictable which inverter transistor M2 and M3 would react more strongly to the charging of the true and complement output nodes by switching on. Such a random state for level-shifter 100 at power-up may be undesirable and can lead to glitches or other errors.

Thus, to ensure a known state at power-up, asymmetry is used in which one of the inverter transistors is made larger than the other. For example, inverter transistor M3 may be made several times larger than inverter transistor M2. Inverter transistor M3 will thus react to the charging of the complement output node at power-up by switching on more strongly than inverter transistor M2. Inverter transistor M3 will thus discharge the complement output node. This discharge reinforces the charging of the true output node such that level-shifter 100 will reliably output a binary zero (via an inverter—not shown) at power-up. Moreover, to further reinforce this known state, transistor P1 may be larger than transistor P2.

Although this asymmetry for the pull-down transistors and the latch provides a known start-up condition and enables high speed operation, asymmetric level shifters are relatively large and lower the density of level-shifter 100. Since level-shifters are used extensively, such large asymmetric designs occupy a large silicon wafer area which increases production costs. Accordingly, there is a need in the art for level-shifter arrays having a known start-up state and high-speed operation with improved density.

SUMMARY

To provide a known start-up state and reduce wafer-area size, illustrative methods and systems of the present disclosure are directed to level shifter architectures in which a master level shifter generates an enable signal used to control one or more slave level shifters. The master level shifter may include an asymmetrical level shifter design that has a known and defined initial state at power up. The asymmetrical master level shifter may also include an unbalanced driver to further reduce its wafer area size. The slave level shifters, however, may be configured as symmetrical level shifters, thus having a smaller size as compared to the asymmetrical master level shifter.

The enable signal from the master level shifter may ensure the slave level shifters have a known power state during a power transition. One illustrative embodiment includes a master level shifter that outputs an enable signal to a multitude of slave level shifters. The slaves are small in size relative to the master level shifter, and the slaves rely on the enable signal for a default state during a change of power state. As will be described below, the grounded nature of the master level shifter during power transitions may ensure the output of a binary 1 enable signal, which in turn may ensure the output of a binary 0 slave output. Once power is restored, the enable signal may be output as a binary 0 at which the slave level shifter will latch a value from its input to its output. Accordingly, through combination of the master-slave array architecture and the unbalanced driver of the master level shifter, a large wafer area saving is achieved as the level shifter array grows in size.

In a generalized embodiment, a level shifter includes a master level shifter having a plurality of power states that generate an enable signal and one or more slave level shifters coupled to receive the enable signal and generate a default output state in response to the enable signal. The master level shifter may include a one-sided NMOS latch having an inverter PMOS transistor cross-coupled with a non-inverter PMOS transistor. As implied by the name, a one-sided NMOS latch includes only one inverter NMOS transistor. The slave level shifter may include cross-coupled PMOS transistors as well, wherein the drain of one of the PMOS transistors being an output node which carries a level-shifted version of a slave input signal. A NOR gate is coupled to receive the level-shifted version of the slave input signal and the enable signal, thereby generating the default output state of the slave level shifters during the power collapse.

In an illustrative generalized embodiment, the master level shifter includes an inverter PMOS transistor and an inverter NMOS transistor having a drain coupled to the drain of the inverter PMOS transistor. A non-inverter PMOS transistor has a drain coupled to the gate of the inverter PMOS transistor and to the gate of the inverter NMOS transistor. The exclusion of a second NMOS inverter in the master one-sided NMOS latch may ensure a known startup state for the master level-shifter. The drain of the inverter PMOS transistor is coupled to a gate of the non-inverter PMOS transistor. A first master pull-down transistor is coupled between the drain of the non-inverter PMOS transistor and ground. A gate of the first master pull-down transistor is coupled to the master input signal node carrying the master input signal from the first power domain powered by a first power supply voltage. A second master pull-down transistor is coupled between the drain of the inverter PMOS transistor and ground. A gate of the second master pull-down transistor is coupled to a master complement input signal node carrying a complement of the master input signal.

A first master head-switch transistor is coupled between the source of the non-inverter PMOS transistor and the master power supply node configured to supply the second power supply voltage for the second power domain. A gate of the first master head-switch transistor is coupled to the master input signal node. A second master head-switch transistor is coupled between a source of the inverter PMOS transistor and the power supply node for the second power supply voltage. A gate of the second master head-switch transistor is coupled to the master complement input signal node. An inverter is coupled to the drain of the inverter PMOS transistor. The drain of the inverter PMOS transistor is an output node for a level-shifted version of the master input signal. The level-shifted version of the master input signal is inverted by the inverter to produce the enable signal.

Still referring to a generalized embodiment, the slave level shifters may include a first slave PMOS transistor and a first slave pull-down transistor coupled between a drain of the first slave PMOS transistor and ground. A gate of the first slave pull-down transistor is coupled to a slave input signal node carrying a slave input signal from the first power domain powered by the first power supply voltage. A second slave PMOS transistor has a drain coupled to a gate of the first slave PMOS transistor. The drain of the first slave PMOS transistor is coupled to a gate of the second slave PMOS transistor and is an output node for a level-shifted version of the slave input signal.

A second slave pull-down transistor is coupled between the drain of the second slave PMOS transistor and ground. A gate of the second slave pull-down transistor is coupled to the complement slave input signal node carrying the complement of the slave input signal. A first slave head-switch transistor is coupled between the source of the first slave PMOS transistor and a slave power supply node that supplies the second power supply voltage for the second power domain. A gate of the first slave head-switch transistor is coupled to the slave input signal node.

A second slave head-switch transistor is coupled between the source of the second slave PMOS transistor and the slave power supply node supplies the second power supply voltage for the second power domain. A gate of the second slave head-switch transistor is coupled to the complement slave input signal node. A NOR gate is coupled to the drain of the first slave PMOS transistor to receive the level-shifted version of the slave input signal and the enable signal, thereby generating the default output state of the slave level shifters during the power collapse.

The exclusion of a second inverter in the master one-sided NMOS latch may ensure a known startup state for the master level-shifter. In particular, both the true input signal IN and its complement INB will be grounded at power-up such that both the first master head-switch transistor and the second master head-switch transistor are conducting at power-up. Similarly, both the master inverter PMOS transistor and the master non-inverter PMOS transistor are conducting at power-up such that the drain for the master inverter PMOS transistor and the drain for the master non-inverter PMOS transistor both begin to charge towards the second power supply voltage. Due to the cross-coupling of the drain for the master non-inverter PMOS transistor to the gate of the master inverter NMOS transistor, the master inverter NMOS transistor thus begins to switch on and discharge the inverter output. This discharge of the master inverter output reinforces the switching on of the master non-inverter PMOS transistor. The drain of the master non-inverter PMOS transistor, which forms one of a true output node or a complement output node for the level-shifter, is thus reliably charged to the second power supply voltage at startup. Similarly, the drain of the master inverter PMOS transistor, which forms a remaining one of the true or complement output nodes for the level-shifter, is reliably discharged at startup and thereby outputs the enable signal utilized by the slave level shifters to define its output state during a power transition.

This known startup state may be achieved without employing device asymmetry in the slave level shifters, which advantageously increases density of the array as each slave transistor (and some of the master) may be sized at the minimum-required size for whatever process node is used to manufacture the level-shifter. For example, the first and second slave pull-down transistors may be sized at this minimum-required size since the struggle with regard to flipping a state of the one-sided NMOS latch is relieved through use of the enable signal.

These and other advantages of the present disclosure will be apparent to those ordinarily skilled in the art having the benefit of this disclosure.

DESCRIPTION OF ILLUSTRATIVE EMBODIMENTS

Illustrative embodiments and related methods of the present disclosure are described below as they might be employed in a master-slave level shifter array architecture and related methods. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

As described herein, illustrative methods of the present disclosure are directed to a level shifter array having a master level shifter controlling a plurality of slave level shifters. The master level shifter has a defined power-up state, while the slave level shifters do not hold a defined power up state, but instead rely on the master level shifter to hold or flip their states when power collapses. The master level shifter also uses an unbalanced driver to further reduce its wafer surface area. Combining the aforementioned features, illustrative embodiments of the present disclosure provide both increased wafer surface area savings and reliability.

Figure 2:
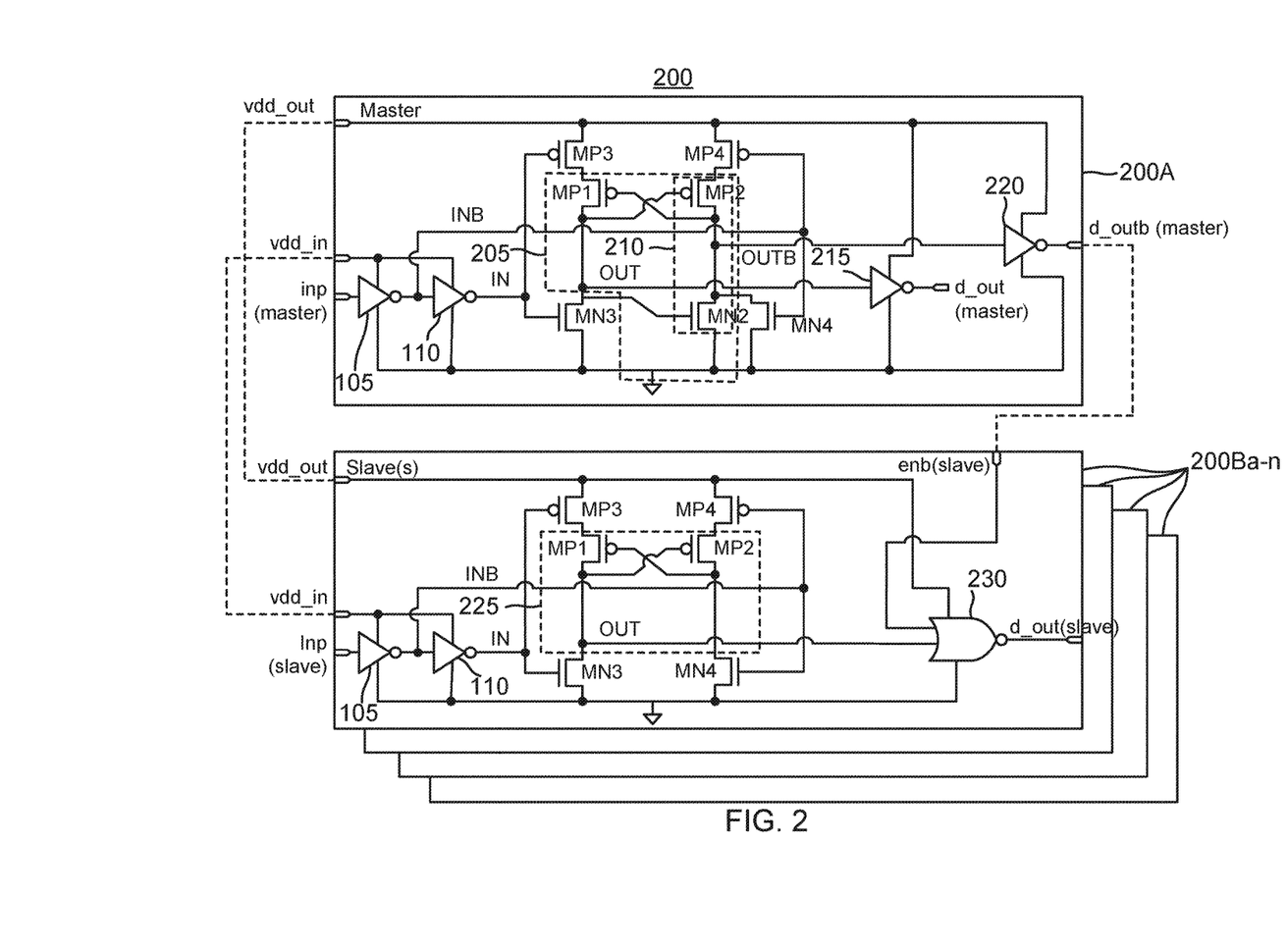
FIG. 2 is a circuit diagram of an example master-slave level shifter array, according to certain illustrative embodiments of the present disclosure.

FIG. 2 is a schematic of a level-shifter array 200 which offers increased density and a known start-up state, according to certain illustrative embodiments of the present disclosure. Level-shifter array 200 includes a master level shifter 200A and a plurality of slave level shifters 200B(a-n). Master level shifter 200A has a pre-defined power up state used to generate an enable signal. Slave level shifters 200B(a-n) are each coupled to master level shifter 200A to receive the enable signal and thereby generate a known default output state during the power collapse.

With reference to FIG. 2, a true master input signal (inp(master) or IN) is generated in a first power domain powered by a first power supply voltage. The following discussion will assume the first power domain is a core power domain powered by a core power supply voltage (vdd_in), but it will be appreciated that level-shifter array 200 may also be used to level-shift from one peripheral power supply voltage to another. Inverters 105 and 110 function within the core power domain as discussed with regard to level-shifter 100. Thus, the true master input signal inp(master) drives inverter 105 powered by the core power supply voltage vdd_in to be inverted into the complement input signal (INB). Inverter 110 is also powered by the core power supply voltage vdd_in and inverts the complement input signal INB back into the true input signal IN. A one-sided NMOS latch 205 latches an output signal OUT carried on a true output node and a complement output signal OUTB carried on a complement output node responsive to the binary states of the true input signal IN and the complement input signal INB.

One-sided NMOS latch 205 is denoted as being "one-sided" because it contains only one inverter 210. Inverter 210 includes an inverter PMOS transistor MP2 having a drain coupled to a drain of an inverter NMOS transistor MN2. The source of inverter transistor MN2 couples to ground. The output of inverter 210 (the drains of inverter transistors MP2 and MN2) forms the complement output node OUTB and also couples to a gate of a non-inverter PMOS transistor MP1. As will be described below, complement output node OUTB is used to generate the enable signal d_outb(master). The drain of non-inverter transistor MP1 couples to the gates of inverter transistors MP2 and MN2 and also forms the true output OUT, which is used to generate the output signal d_out(master).

One-sided latch 205 is powered through a pair of master head-switch transistors in a second power domain such as vdd_out or some other input/output power domain. In particular, the source of non-inverter transistor MP1 couples to a drain of a first head-switch PMOS transistor MP3 having a source tied to a vdd_out power supply node supplying the vdd_out power supply voltage, which is greater than the core power supply voltage vdd_in. Similarly, the source of inverter transistor MP2 couples to a drain of a second master head-switch PMOS transistor MP4 having a source also tied to the vdd_out power supply node.

In certain illustrative embodiments, the true input signal IN drives a gate of first pull-down NMOS transistor MN3 having a source coupled to ground and drain coupled to the true output node OUT (drain of non-inverter transistor MP1). Note that first pull-down NMOS transistor MN3 is the only path to ground for discharging the true output node OUT since non-inverter transistor MP1 is not included into any inverter such as inverter 210. The input signal IN carried on the true input signal node also drives a gate of first head-switch transistor MP3. Note that it is arbitrary to denote the drain of non-inverter transistor MP1 as the true output node OUT. In an alternative embodiment, the drain of non-inverter transistor MP1 may form the complement output node OUTB. In that case, it would be the complement input signal that would drive the gate of first pull-down transistor MN3 and first head-switch transistor MP3.

The master complement input signal (INB) carried on a complement input signal node drives a gate of second master pull-down NMOS transistor MN4 having a source coupled to ground and a drain coupled to the complement output node OUTB (the drain of inverter transistor MP2 and the drain of inverter transistor MN2). In contrast to the true output node OUT, the complement output node OUTB thus has two paths to ground: one through inverter transistor MN2 and one through second master pull-down transistor MN4. The complement input signal also drives a gate of second master head-switch transistor MP4. It is also arbitrary to denote the drain of inverter transistor MP2 as the complement output node OUTB. In an alternative embodiment, the drain of inverter transistor MP2 may form the true output node OUT. In such an embodiment, it would then be the true input signal IN that would drive the gates of the second master pull-down transistor MN4 and the second master head-switch transistor MP4.

Output inverter 215 is coupled to the true output node OUT located at the drains of non-inverter transistor MP1 and first master pull-down transistor MN3. Thus, inverter 215 receives a level-shifted version of the master input signal inp(master), inverts the signal, then outputs d_out(master). Inverter 220, however, is coupled to the complement output node OUTB located at the drains of inverter transistor MP2 and inverter transistor MN2. Thus, inverter 220 receives a level shifted version of the master input signal inp(master), inverts the signal, then outputs the enable signal d_outb (master).

As can be seen, master level shifter 200A is skewed (i.e., asymmetrical) because latch 205 is one-sided. Additional asymmetry includes an unbalanced driver including a first master pull-down NMOS transistor MN3 and a second master pull-down NMOS transistor NM4. Since latch 205 is skewed, its inherent tendency once power-up begins is for complementary OUTB=0 and true output OUT=1. Thus, second master pull-down transistor MN4 does not have to be as strong as (same size with regard to channel width and length) first master pull-down transistor MN3 and can be sized smaller to save wafer area. For example, in certain illustrative embodiments, first master pull-down transistor MN3 may be 12*(192n/150n), while second master pull-down transistor MN4 is 4*(192n/150n), thus making MN4 three times smaller than MN3. In addition, non-inverter transistor MP1 may be 5*(192/150n) while MP2 is 1*(192n/150n), thus making MP2 five times smaller than MP1. Moreover, first and second master head-switch transistors MP3 and MP4 may be 1*(192n/150n), while inverter NMOS transistor MN2 is 4*(192n/150n). In addition, inverters 105 and 110 may both be 1*(96n/16n) and output inverters 215 and 220 may both be 2*(192n/150n). Thus, in certain illustrative embodiments, the unbalanced driver and one-sided latch of the master level shifter and may be referred to as a means for generating the enable signal. Accordingly, the asymmetric nature of master level shifter 200A may ensure the OUTB will be a binary 0 while also conserving wafer space. Of course, the scope of embodiments may include any appropriate values for transistor sizes.

Still referencing FIG. 2, slave level shifters 200B(a-n) also receive a true slave input signal (inp(slave) or IN) which may be different from inp(master). The number n of slave level shifters 200B may be any desired number, such as 50 or 100 or more. Thus, a single master level shifter may control n number of slave level shifters. In a given array, multiple master level shifters may control a respective group of slave level shifters. In fact, a given application may include hundreds, thousands, or even millions of level shifters in total. The advantage of such designs provides space savings by using as many symmetrical slave level shifters as appropriate while keeping dependability high by virtue of the master level shifter with a defined initial state.

True slave input signal inp(slave) is also generated in the same power domain and voltage of vdd_in. In many ways, slave level shifters 200B(a-n) operate in similar fashion to master slave level shifter 200A, so like elements are identified as shown in master level shifter 200A. for example, inverters 105 and 110 function within the core power domain as discussed with regard to level-shifter 100, and thus are labeled the same. The true slave input signal inp(slave) drives inverter 105 powered by the core power supply voltage vdd_in to be inverted into the complement slave input signal (INB). Inverter 110 is also powered by the core power supply voltage vdd_in and inverts the complement slave input signal back into the true slave input signal.

However, unlike master level shifter 200A, slave level shifter 200B does not include inverter 210. Instead, slave level shifter 200B simply includes a cross-coupled first slave PMOS transistor MP1 and second slave PMOS transistor MP2 forming a latch 225. In this illustrative embodiment, latch 225 only latches a true output signal carried on a true output node OUT located at the drains of first slave PMOS transistor MP1 and first slave pull-down transistor MN3. No slave complement output signal OUTB is provided. The true slave output node OUT is coupled to a NOR gate 230 which is also coupled to receive the enable signal d_outb(master). After the logic is performed on the master enable signal and slave OUT signal by NOR gate 230, d_out(slave) is output. Thus, NOR gate 230 provides a predefined d_out(slave)=0 when the enable signal d_outb(master) is =1. Through the use of output NOR gate 230, slave level shifter(s) 200B(a-n) operate the same as the skewed master level shifter 200A when vdd_in =0.

In this illustrative embodiment, slave level shifters 200B (a-n) are symmetric in nature. Thus, in certain embodiments, a symmetrical level shifter may be deemed a means for generating a default output state during a power collapse. With regard to symmetry, for example, first and second PMOS transistors MP1 and MP2 may both be 1*(192n/150n), first and second slave pull-down NMOS transistors MN3 and MN4 may both be 4*(192n/150n), first and second slave head-switch transistors MP3 and MP4 may both be 1*(192n/150n), input slave inverters 105 and 110 may both be 1*(96n/16n), and the transistors (not shown) of output NOR gate 230 may both be 1*(96n/150n). Thus, the transistors of slave level shifters 200B(a-n) may be sized to the minimum allowed size, thus exponentially saving wafer space as more slave level shifters are added to the array. Of course, the scope of embodiments may include any appropriate values for transistor sizes.

Now that the architecture of master-slave level shifter array 200 has been described, its operation will now be discussed. At the initiation of power-up (after some power transition or collapse), both the true input signal IN and its complement INB (of master and slave level shifters) are grounded. Thus, with regard to master level shifter 200A, first master pull-down transistor MN3 and the second master pull-down transistor MN4 are both off. The master true output signal OUT and its complement OUTB are also grounded such that both the non-inverter transistor MP1 and the inverter transistor MP2 are conducting.

The grounded state for the true input signal IN and its complement INB also means that the first master head-switch transistor MP3 and the second master head-switch transistor MP4 are conducting. The power supply (not illustrated) charging the vdd_out power supply voltage at the master power supply node will thus cause the drains of the non-inverter transistor MP1 and the inverter transistor MP2 to rise in voltage in response to the initiation of the power-up of master level-shifter 200A. Since the drain of non-inverter transistor MP1 is cross-coupled to the gate of inverter transistor MN2, this rise in voltage causes inverter transistor MN2 to switch on and discharge the complement output node OUTB (the drain of inverter transistor MP2).

Given that the complement output node OUTB is cross-coupled to the gate of non-inverter transistor MP1, the discharge of the complement output node OUTB reinforces the on-state of non-inverter transistor MP1 such that the true output node quickly charges to its startup state of being charged to the vdd_out power supply voltage. Similarly, the complement output node OUTB is discharged to a startup state of being grounded or equal to binary 0. The complement OUTB signal is then inverted by output inverter 220 to produce an enable d_outb(master) signal=1 which, when coupled with the true slave output OUT at NOR gate 230, always produces a predefined d_out(slave) signal=0. Thus, the design of master level shifter may ensure that master OUTB signal is =0 during power-up.

Also, with regards to slave level shifter(s) 200B(a-n), at the initiation of power-up, both the true input signal IN and its complement INB are grounded. Thus, first slave pull-down transistor MN3 and the second slave pull-down transistor MN4 are both off. The slave true output signal OUT is also grounded such that both the first slave transistor MP1 and the second slave transistor MP2 are conducting. The grounded state for the true input signal IN also means that the first slave head-switch transistor MP3 and the second slave head-switch transistor MP4 are conducting. The power supply (not illustrated) charging the vdd_out power supply voltage will thus cause the drains of the first slave transistor MP1 and the second slave transistor MP2 to rise in voltage in response to the initiation of the power-up of slave level-shifter 200B.

Since the drains of first and second slave transistors MP1 and MP2 are cross-coupled to the gates of one another, it cannot be predetermined if true output node OUT will discharge before the drain of second slave transistor MP2. However, given the logic of NOR gate 230, it does not matter whether slave OUT is =1 or 0. Since, the enable signal d_outb(master) is =1, the d_out(slave) will always be=0, thus generating a predefined default output state upon power-up controlled by the enable signal.

These known start-up states may be achieved without employing asymmetry in the slave devices for level-shifter array 200. Rather, the transistors of slave level shifters 200B(a-n) may have the minimum size required for whatever process node is used to manufacture slave level shifter(s) 200B(a-n) and those of master level shifter 200A previously discussed. In this fashion, density is markedly improved over conventional level-shifters while also maintaining high reliability upon power collapse or transition.

After power-up, master-slave level shifter array 200 is ready to receive the input signals. If the true master input signal is asserted to the core power supply voltage vdd_in, the first master pull-down transistor MN3 is switched on to discharge the true output node OUT. Although master non-inverter transistor MP1 had been conducting at start-up, it will not struggle with this discharge since it is weakened through the assertion of the input signal weakly shutting off the first master head-switch transistor MP3. With first master head-switch transistor MP3 being weakly off, master non-inverter transistor MP1 is starved of charge, which allows first master pull-down transistor MN3 to be sized approximately the same (same channel width and length), for example, as used for the devices in one-sided latch 205. The discharge of the true output node OUT causes inverter transistor MP2 to conduct so that the complement output node OUTB is charged to the power supply voltage vdd_out. Output inverter 215 inverts the grounded true output signal OUT to a binary 1 at d_out(master). Thus, the true input signal IN that was charged to the core power supply voltage vdd_in is thus level-shifted to the power supply voltage vdd_out.

Note, however, that complement output signal OUTB is charged to a binary 1. Output inverter 220 will invert OUTB to a binary 0 at d_outb(master), the enable signal. The enable signal will then be received by output NOR gate 230 of slave level shifter(s) 200B(a-n), thereby enabling level-shifter(s) 200B(a-n) to begin level shifting input signals. In this illustrative embodiment, the slave output node OUT must be a binary 0 in order to perform level shifting. Thus, when a true slave input signal is asserted to the core power supply voltage vdd_in, the first slave pull-down transistor MN3 is switched on to discharge the true slave output node OUT. Although first slave transistor MP1 had been conducting at start-up, it will not struggle with this discharge since it is weakened through the assertion of the input signal weakly shutting off the first slave head-switch transistor MP3. With first slave head-switch transistor MP3 being weakly off, first slave transistor MP1 is starved of charge. The discharge of the true slave output node OUT reinforces the on state of MP2 and charges its drain, which in turn shuts off MP1 because its gate is coupled to the drain of MP2. Slave output node OUT is thus reliably a binary 0 which, when received by NOR gate 230 (along with a binary 0 enable signal), generates a binary 1 at d-out(slave). Thus, the true slave input signal inp(slave) that was charged to the core power supply voltage vdd_in is thus level-shifted to the power supply voltage vdd_out.

Figure 3:
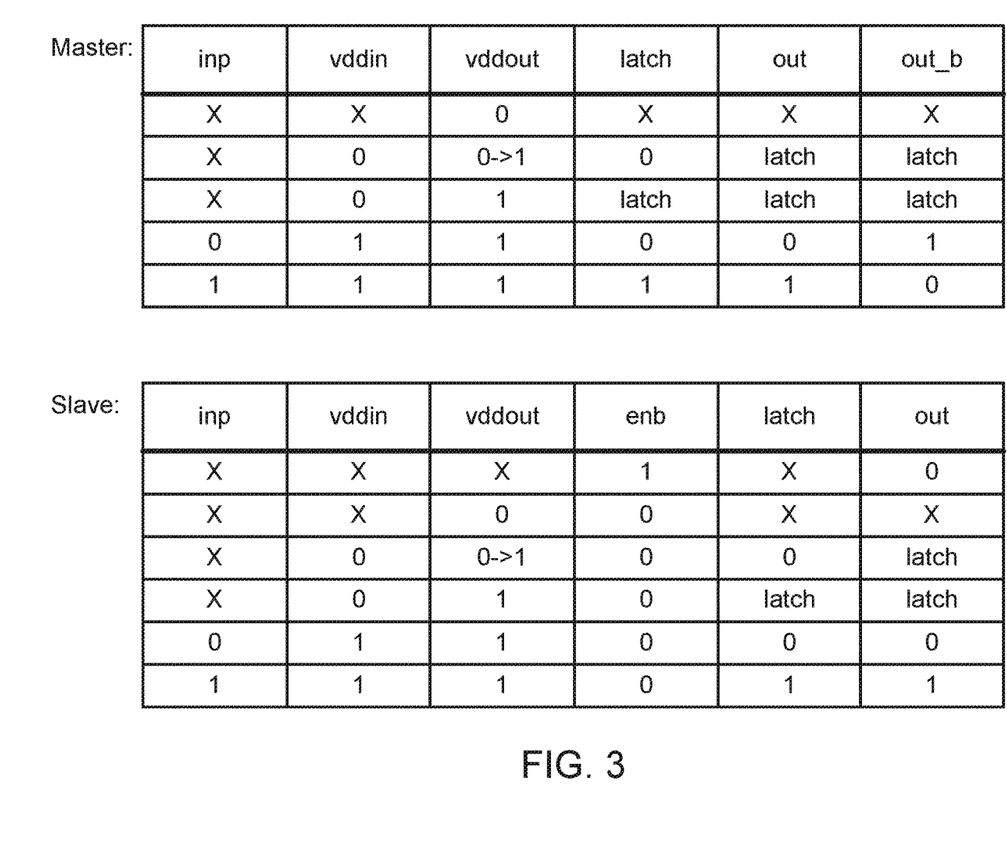
FIG. 3 shows example truth tables for a master and slave level shifter, according to certain illustrative embodiments of the present disclosure.

FIG. 3 is a truth table for the master and slave level shifters, according to certain illustrative embodiments of the present disclosure. As can be seen, the operation truth table for the slave is the same as a master skewed level shifter with a predefined output state. The first row for the master shows that when vddout=0, there is no working state for any points in the circuit ("x" denotes an indeterminate state). When master vdd_out goes to 1 (as shown in $2^{nd}$ row), the output is predetermined. So, the latch of the $2^{nd}$ row is shown=0, while out and out_b follow the latch. The $3^{rd}$ row shows that when vddout is high, the latch is latching to the input (inp) and the out and outb follow the latch level. The $4^{th}$ and $5^{th}$ rows show that when vddin and vddout are on, the master functions as a regular level shifter would be intended to operate dependent on the input.

With regard to the slave operation truth table, it is shown how the slave relies on the enable signal from the master to determine its output. The first row of the slave truth table shows that even if the circuit inputs are mostly indeterminate, the enable signal is still be received and produces a 0 out signal, thus the master still provides a predetermined state for the slave. The $2^{nd}$-$4^{th}$ rows show rely fully on the master enable signal. The last two slave rows depend on their own inputs to determine their outputs (and the enable signal is =0 in both cases), thus corresponding to the use of NOR gate 230.

Figure 4:
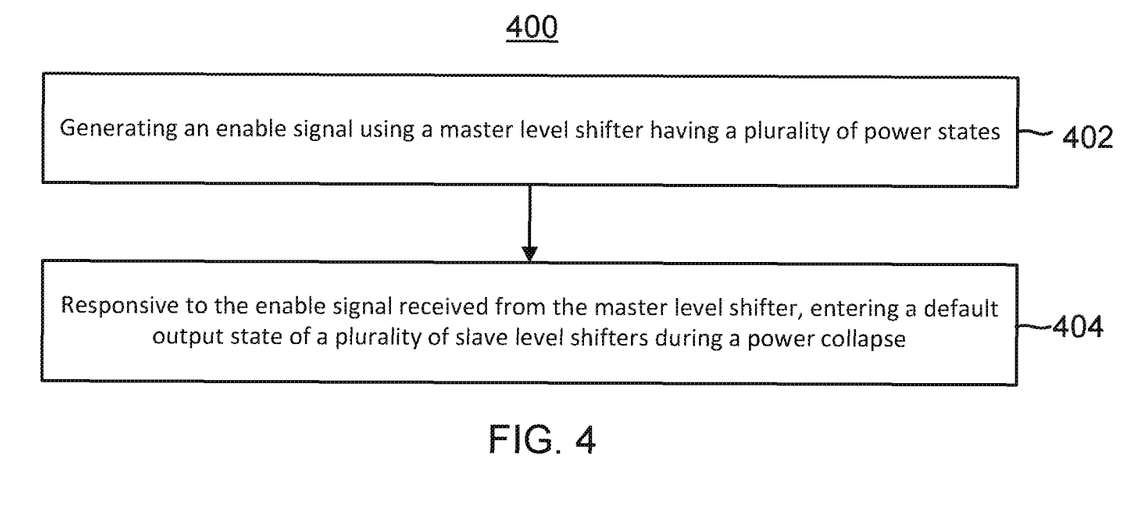
FIG. 4 is a flowchart for an example level-shifting method of operation, according to certain illustrative methods of the present disclosure.

FIG. 4 is a flowchart for a level-shifting method of operation, according to certain illustrative methods of the present disclosure. Method 400 includes an act 402 of generating an enable signal using a master level shifter having a plurality of power states. An example of this generation is, during a power collapse, master output nodes OUT and OUTB are grounded. The master complement OUTB signal is then inverted to a binary 1 as d_outb(master) and received by NOR gate 230. At block 404, responsive to the enable signal received from the master level shifter, the slave level shifter(s) enters a default output state during a power collapse. Here in this act, given the logic of NOR gate 230, a binary 1 will always generate a binary 0 d_out(slave), thus providing a predictable default output state during a power transition.

The present disclosure provides a variety of advantages. As described herein, the illustrative master-slave level shifter arrays combine wafer space saving and reliability during a power transition. With regard to space savings for example, a 10×10 master-slave level shifter may include 1 master level shifter coupled to 99 slave level shifters having a total wafer area of 34.8×31.03+3.103×1.82=1085.5 um². In comparison, a conventional array of 100 asymmetric level shifters would have a wafer area of 53×31.03=1644.6 um². Therefore, illustrative embodiments of the present disclosure may provide a 34% silicon area savings in comparison to conventional designs. Of course, the scope of embodiments includes any appropriate wafer size.

Moreover, the yield of the master-slave arrays are improved over conventional designs. For example, a conventional level shifter with a skewed latch has a very low probability to output an incorrect state during a power collapse—perhaps 0.01% for each level shifter. Thus, the yield for one asymmetrical latch is 99.99%. Now, consider the case where there are 1000 conventional skewed level shifters that require a predefined state during a power collapse. The yield for all 1000 conventional level shifters to output correct states during a power collapse would be $0.9999^{1000}$ or 90.5%. However, using the illustrative master-level shifter arrays described herein, the yield will be $0.9999^n$, where n may be ~20 slave level shifters in a typical chip, thereby providing a yield of $0.9999^{20}$ or 99.8%. Thus, the master-slave design greatly reduces the wafer size while providing a much improved reliability.

Although various embodiments and methods have been shown and described, the disclosure is not limited to such embodiments and methods and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A level shifter array, comprising:
a master level shifter having a plurality of power states and configured to generate an enable signal in response to a change of power state; and
a plurality of slave level shifters coupled to the master level shifter and configured to receive the enable signal and to generate a default output state of the slave level shifters in response to the enable signal, wherein each of the plurality of slave level shifters comprises:
an output node carrying a level-shifted version of a slave input signal; and
a NOR gate coupled to receive the level-shifted version of the slave input signal and the enable signal, thereby generating the default output state of the slave level shifters in response to the enable signal.

2. The level shifter array as defined in claim 1, wherein:
the master level shifter is asymmetrical; and
the slave level shifters are symmetrical.

3. The level shifter array as defined in claim 1, wherein a wafer surface area of a single slave level shifter is smaller in size relative to a wafer surface area of the master level shifter.

4. The level shifter array as defined in claim 1, wherein the master level shifter comprises an unbalanced driver having a first and a second pull-down transistor, the first pull-down transistor being larger than the second pull-down transistor.

5. The level shifter array as defined in claim 1, wherein the master level shifter comprises:
an inverter PMOS transistor;
an inverter NMOS transistor having a drain coupled to a drain of the inverter PMOS transistor;
a non-inverter PMOS transistor having a drain coupled to a gate of the inverter PMOS transistor and to a gate of the inverter NMOS transistor, wherein the drain of the inverter PMOS transistor is coupled to a gate of the non-inverter PMOS transistor;
a first master pull-down transistor coupled between the drain of the non-inverter PMOS transistor and ground, wherein a gate of the first master pull-down transistor is coupled to a master input signal node carrying a master input signal from a first power domain powered by a first power supply voltage;
a second master pull-down transistor coupled between the drain of the inverter PMOS transistor and ground, wherein a gate of the second master pull-down transistor is coupled to a master complement input signal node carrying a complement of the master input signal;
a first master head-switch transistor coupled between a source of the non-inverter PMOS transistor and a power supply node configured to supply a second power supply voltage for a second power domain, the second power supply voltage being greater than the first power supply voltage, wherein a gate of the first master head-switch transistor is coupled to the master input signal node;
a second master head-switch transistor coupled between a source of the inverter PMOS transistor and the power supply node configured to supply the second power supply voltage for the second power domain, wherein a gate of the second master head-switch transistor is coupled to the master complement input signal node; and
an inverter coupled to the drain of the inverter PMOS transistor, wherein the drain of the inverter PMOS transistor is an output node for a level-shifted version of the master input signal, the level-shifted version of the master input signal being inverted by the inverter to produce the enable signal.

6. The level shifter array as defined in claim 5, wherein the first master pull-down transistor is larger in size relative to the second master pull-down transistor.

7. The level shifter array as defined in claim 5, wherein the slave level shifter comprises:
a first slave PMOS transistor;
a first slave pull-down transistor coupled between a drain of the first slave PMOS transistor and ground, wherein a gate of the first slave pull-down transistor is coupled to a slave input signal node carrying a slave input signal from the first power domain powered by the first power supply voltage;
a second slave PMOS transistor having a drain coupled to a gate of the first slave PMOS transistor, wherein the drain of the first slave PMOS transistor is coupled to a gate of the second slave PMOS transistor and is an output node for a level-shifted version of the slave input signal;
a second slave pull-down transistor coupled between the drain of the second slave PMOS transistor and ground, wherein a gate of the second slave pull-down transistor is coupled to a complement slave input signal node carrying a complement of the slave input signal;
a first slave head-switch transistor coupled between a source of the first slave PMOS transistor and a slave power supply node configured to supply the second power supply voltage for a second power domain, the second power supply voltage being greater than the first power supply voltage, wherein a gate of the first slave head-switch transistor is coupled to the slave input signal node;

a second slave head-switch transistor coupled between a source of the second slave PMOS transistor and the slave power supply node configured to supply the second power supply voltage for the second power domain, wherein a gate of the second slave head-switch transistor is coupled to the complement slave input signal node; and a NOR gate coupled to the drain of the first slave PMOS transistor to receive the level-shifted version of the slave input signal and the enable signal, thereby generating the default output state of the slave level shifters in response to the enable signal.

8. The level shifter as defined in claim 7, wherein:

the first and second slave PMOS transistors have approximately the same size; or the first and second slave pull-down transistors have approximately the same size.

9. A level shifter array, comprising:

a master level shifter having a means for generating an enable signal based upon a pre-defined power-up state; and one or more slave level shifters having a means for generating a default output state using the enable signal and a level-shifted version of a slave input signal during a power collapse, wherein:

the means for generating the enable signal comprises an asymmetrical level shifter having a one-sided latch and unbalanced driver;

the means for generating the default output state comprises a symmetrical level shifter, and wherein the master level shifter comprises an unbalanced driver having a first and second pull-down transistor, the first pull-down transistor being larger in size than the second pull-down transistor.

10. The level shifter array as defined in claim 9, wherein a wafer surface area of the slave level shifter is smaller than a wafer surface area of the master level shifter.

* * * * *